(12) United States Patent
Wang et al.

(10) Patent No.: US 11,516,908 B1
(45) Date of Patent: Nov. 29, 2022

(54) ELECTRONIC DEVICES HAVING IMAGE TRANSPORT LAYERS WITH EMBEDDED CIRCUITRY

(71) Applicant: Apple Inc., Cupertino, CA (US)

(72) Inventors: Ying-Chih Wang, Sunnyvale, CA (US); Michael J. Brown, Campbell, CA (US); Michael B. Wittenberg, San Francisco, CA (US); Paul C. Kelley, San Francisco, CA (US); Rasamy Phouthavong, San Jose, CA (US); Tyler R. Kakuda, Stockton, CA (US); Jean-Pierre S. Guillou, Los Gatos, CA (US); Marwan Rammah, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/682,146

(22) Filed: Nov. 13, 2019

Related U.S. Application Data

(60) Provisional application No. 62/760,669, filed on Nov. 13, 2018.

(51) Int. Cl.
*H05K 1/02* (2006.01)
*H01L 51/52* (2006.01)
*H05K 5/00* (2006.01)
*H05K 5/03* (2006.01)
*H05K 1/18* (2006.01)
(Continued)

(52) U.S. Cl.
CPC .......... *H05K 1/0274* (2013.01); *G02B 6/06* (2013.01); *G06F 3/0412* (2013.01); *G06F 3/0446* (2019.05); *H01L 51/5237* (2013.01); *H01Q 1/40* (2013.01); *H05K 1/185* (2013.01); *H05K 1/189* (2013.01); *H05K 5/0017* (2013.01); *H05K 5/03* (2013.01); *H05K 2201/10128* (2013.01); *H05K 2201/10151* (2013.01)

(58) Field of Classification Search
CPC ....... G06F 3/0446; G06F 3/0412; G02B 6/06; H01L 51/5237; H01Q 1/40; H05K 5/0017; H05K 5/03; H05K 1/0274; H05K 1/185; H05K 1/189
USPC .................................. 345/173–176
See application file for complete search history.

(56) References Cited

U.S. PATENT DOCUMENTS

| | | | |
|---|---|---|---|
| 4,349,817 A | 9/1982 | Hoffman et al. | |
| 4,534,813 A | 8/1985 | Williamson et al. | |

(Continued)

FOREIGN PATENT DOCUMENTS

KR 20180034832 A 4/2018

*Primary Examiner* — Jimmy H Nguyen
(74) *Attorney, Agent, or Firm* — Treyz Law Group, P.C.; G. Victor Treyz; David K. Cole

(57) ABSTRACT

An electronic device may have a display with pixels configured to display an image. The pixels may be overlapped by a cover layer. An image transport layer may be formed from a coherent fiber bundle or Anderson localization material. The image transport layer may overlap the pixels and may have an input surface that receives the image from the pixels and a corresponding output surface on which the received image is viewable through the cover layer. Circuitry may be embedded within the image transport layer. The circuitry that is embedded within the image transport layer may include capacitive touch sensor circuitry, antenna resonating element structures, input-output components, signal lines, and other circuitry.

19 Claims, 15 Drawing Sheets

(51) Int. Cl.
*G02B 6/06* (2006.01)
*G06F 3/044* (2006.01)
*G06F 3/041* (2006.01)
*H01Q 1/40* (2006.01)

(56) References Cited

U.S. PATENT DOCUMENTS

| | | |
|---|---|---|
| 5,329,386 A | 7/1994 | Birecki et al. |
| 5,502,457 A | 3/1996 | Sakai et al. |
| 5,659,378 A | 8/1997 | Gessel |
| 6,046,730 A | 4/2000 | Bowen et al. |
| 6,407,785 B1 | 6/2002 | Yamazaki |
| 6,467,922 B1 | 10/2002 | Blanc et al. |
| 6,680,761 B1 | 1/2004 | Greene et al. |
| 6,845,190 B1 | 1/2005 | Smithwick et al. |
| 7,228,051 B2 | 6/2007 | Cok et al. |
| 7,542,209 B2 | 6/2009 | McGuire, Jr. |
| 7,823,309 B2 | 11/2010 | Albenda |
| 7,856,161 B2 | 12/2010 | Tabor |
| 8,045,270 B2 | 10/2011 | Shin et al. |
| 8,723,824 B2 | 5/2014 | Myers et al. |
| 8,824,779 B1 | 9/2014 | Smyth |
| 8,976,324 B2 | 3/2015 | Yang et al. |
| 9,268,068 B2 | 2/2016 | Lee |
| 9,312,517 B2 | 4/2016 | Drzaic et al. |
| 9,342,105 B2 | 5/2016 | Choi et al. |
| 9,509,939 B2 | 11/2016 | Henion et al. |
| 9,591,765 B2 | 3/2017 | Kim et al. |
| 9,755,004 B2 | 9/2017 | Shieh et al. |
| 9,818,725 B2 | 11/2017 | Bower et al. |
| 9,907,193 B2 | 2/2018 | Lee et al. |
| 10,048,532 B2 | 8/2018 | Powell et al. |
| 10,052,831 B2 | 8/2018 | Welker et al. |
| 2006/0016448 A1 | 1/2006 | Ho |
| 2007/0097108 A1 | 5/2007 | Brewer |
| 2008/0144174 A1 | 6/2008 | Lucente et al. |
| 2008/0186252 A1 | 8/2008 | Li |
| 2010/0177261 A1 | 7/2010 | Jin et al. |
| 2010/0238090 A1 | 9/2010 | Pomerantz et al. |
| 2010/0265161 A1* | 10/2010 | Harrysson ............... H01Q 1/243 345/2.3 |
| 2011/0025594 A1 | 2/2011 | Watanabe |
| 2011/0057861 A1 | 3/2011 | Cok et al. |
| 2011/0102300 A1 | 5/2011 | Wood et al. |
| 2011/0242686 A1 | 10/2011 | Watanabe |
| 2012/0218219 A1 | 8/2012 | Rappoport et al. |
| 2013/0081756 A1 | 4/2013 | Franklin et al. |
| 2013/0083080 A1 | 4/2013 | Rappoport et al. |
| 2013/0235560 A1 | 9/2013 | Etienne et al. |
| 2013/0279088 A1 | 10/2013 | Raff et al. |
| 2014/0037257 A1* | 2/2014 | Yang ..................... G02B 6/0078 385/116 |
| 2014/0092028 A1 | 4/2014 | Prest et al. |
| 2014/0092346 A1* | 4/2014 | Yang ..................... H01L 27/323 349/84 |
| 2014/0183473 A1 | 7/2014 | Lee et al. |
| 2014/0240985 A1 | 8/2014 | Kim et al. |
| 2014/0328041 A1 | 11/2014 | Rothkopf et al. |
| 2014/0354920 A1 | 12/2014 | Jang et al. |
| 2015/0093087 A1 | 4/2015 | Wu |
| 2015/0227227 A1 | 8/2015 | Myers et al. |
| 2016/0231784 A1 | 8/2016 | Yu et al. |
| 2016/0234362 A1 | 8/2016 | Moon et al. |
| 2017/0235341 A1 | 8/2017 | Huitema et al. |
| 2018/0052312 A1 | 2/2018 | Jia et al. |
| 2018/0088416 A1 | 3/2018 | Jiang et al. |
| 2018/0128973 A1* | 5/2018 | Powell ..................... G02B 6/08 |
| 2018/0372958 A1 | 12/2018 | Karafin et al. |

* cited by examiner

ELECTRONIC DEVICES HAVING IMAGE TRANSPORT LAYERS WITH EMBEDDED CIRCUITRY

This application claims the benefit of provisional patent application No. 62/760,669, filed Nov. 13, 2018, which is hereby incorporated by reference herein in its entirety.

FIELD

This relates generally to electronic devices, and, more particularly, to integrating circuitry into electronic device structures.

BACKGROUND

Electronic devices such as cellular telephones, tablet computers, and other electronic equipment may include sensors, wireless components, and other electrical components.

If care is not taken, electronic devices may not have a desired appearance or may be difficult to use satisfactorily. For example, when electrical components are incorporated into an electronic device with a display, the device may be bulky and unattractive or may not exhibit desired performance.

SUMMARY

An electronic device may have a display. The display may be coupled to a housing and covered with a display cover layer. Pixels in the display may be configured to display an image.

The electronic device may have an image transport layer that is interposed between the display and the display cover layer. The image transport layer may be formed from a coherent fiber bundle or Anderson localization material.

The image transport layer may have an input surface that receives the image that is being displayed by the pixels and may have a corresponding output surface. The received image from the input surface may be transported through the image transport layer to the output surface. The image that is presented on the output surface may be viewed by a user through the cover layer.

The electronic device may have circuitry that is embedded within the image transport layer. The circuitry that is embedded within the image transport layer may include capacitive touch sensor circuitry, antenna resonating element structures, input-output components, signal lines, and other circuitry.

DETAILED DESCRIPTION

Electronic devices may be provided with displays. A display in an electronic device may have an array of pixels for displaying images. To help enhance device aesthetics and/or to help enhance performance, the electronic device may include structures that transport light from an input surface to an output surface through coherent fiber bundle or a layer of Anderson localization material. Structures such as these may sometimes be referred to as image transport layers, image transport structures, image transport layer structures, etc.

As an example, an electronic device may have a display on which an image is displayed. An image transport layer may overlap the display so that an input surface of the image transport layer is adjacent to the display and receives the image from the display. The image transport layer transports the image from the input surface to a corresponding output surface of the image transport layer. The output surface faces outwardly from the device so that the image on the output surface may be viewed by a user of the electronic device. If desired, the output surface may have a curved cross-sectional profile.

To enhance device functionality, circuitry may be embedded within the image transport layer of an electronic device. The circuitry may include signal lines, electrodes for sensors, electrical components, haptic output components, sensors, antenna resonating elements, and/or other circuitry. If desired, the image transport layer may be configured to hide embedded circuitry from view from a user. For example, some or all of a metal structure may be embedded within an image transport layer at a location between the input and output surface. Fibers or other material such as Anderson localization material in the image transport layer may be bent around the metal structure to accommodate the metal structure within the image transport layer. During operation, an image from a display that is provided to the input surface of the image transport layer may be transported to the output surface for viewing by a user. When the output surface is viewed, the embedded metal structure may be hidden from view, thereby enhancing the appearance of the device.

Figure 1:
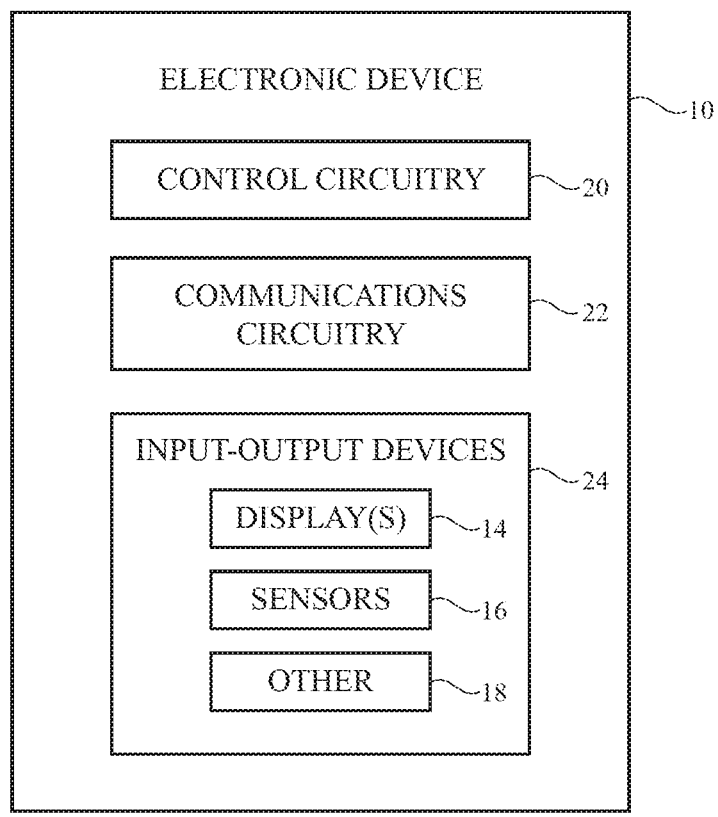
FIG. 1 is a schematic diagram of an illustrative electronic device in accordance with an embodiment.

A schematic diagram of an illustrative electronic device having an image transport layer is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display(s) 14. Display 14 may be an organic light-emitting diode display, a liquid crystal display, an electrophoretic display, an electrowetting display, a plasma display, a micro-electromechanical systems display, a display having a pixel array formed from crystalline semiconductor light-emitting diode dies (sometimes referred to as microLEDs), and/or other display. Display 14 may have an array of pixels configured to display images for a user. The display pixels may be formed on one or more substrates such as one or more flexible substrates (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
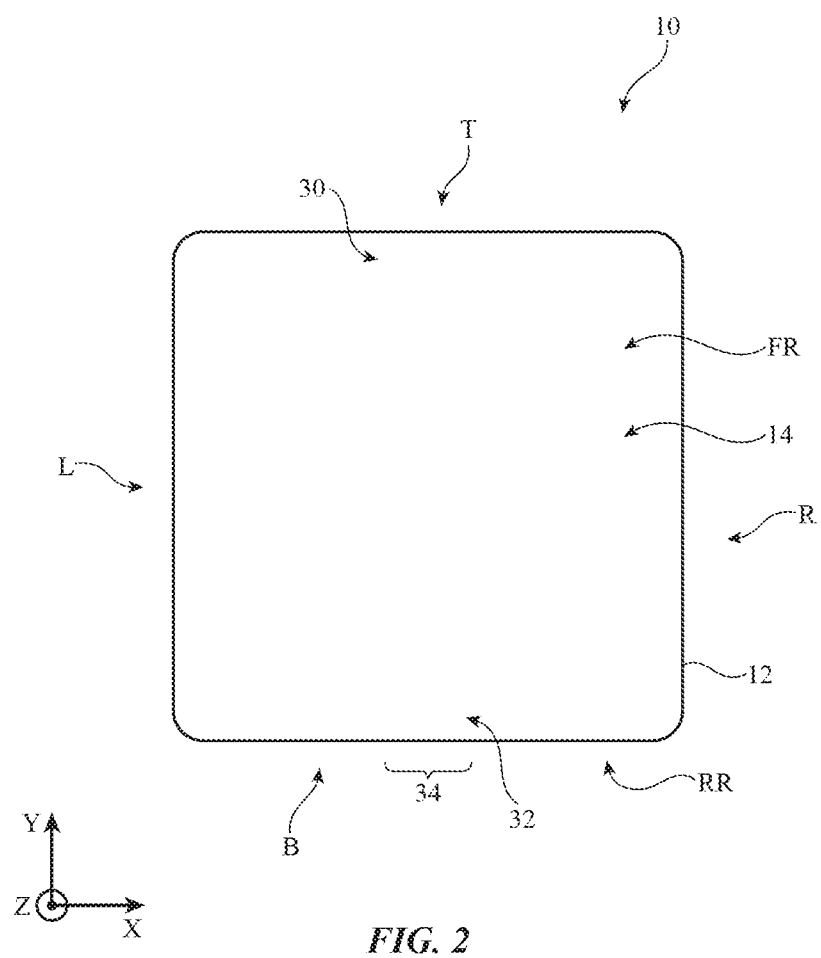
FIG. 2 is a top view of an illustrative electronic device in accordance with an embodiment.

FIG. 2 is a front (plan) view of electronic device 10 in an illustrative configuration in which display 14 covers some or all of the front face FR of device 10. Opposing rear face RR of device 10 may be covered by a housing wall formed from glass, metal, polymer, and/or other materials. Rear face RR may be free of display pixels and/or may be partly or fully covered by display 14.

Device 10 may include a housing (e.g., housing 12) that forms sidewall structures for device 10 and/or internal supporting structures (e.g., a frame, midplate member, etc.). Glass structures, transparent polymer structures, image transport layer structures, and/or other transparent structures that cover display 14 and other portions of device 10 may provide structural support for device 10 and may sometimes be referred to as housing structures. For example, a glass or polymer layer that covers and protects a pixel array in display 14 may serve as a display cover layer while also serving as a housing structure for device 10.

In some illustrative arrangements, sidewall portions of device 10 may be covered with portions of display 14. In the example of FIG. 2, device 10 is characterized by four peripheral edges: upper edge T, lower edge B, left edge L, and right edge R. Upper edge T and opposing lower edge B may run parallel to each other and parallel to the X axis of FIG. 2. Left edge L and opposing right edge R may run parallel to each other and parallel to the Y axis of FIG. 2. Front face FR and rear face RR may be planar (e.g., two parallel planes offset by a distance along the Z axis) and/or may include curved portions.

Touch sensor circuitry such as two-dimensional capacitive touch sensor circuitry may be incorporated into one or more displays in device 10 as separate touch sensor panels overlapping display pixels or as part of one or more display panels in device 10. Touch sensors may be formed on front face FR, rear face RR, and/or edges (sidewall faces) T, B, R, and/or L. If desired, icons and other images for virtual buttons may be displayed by the pixels of device. For example, virtual buttons and/or other images may be displayed on front face FR, rear face RR, and/or edges T, B, R, and/or L and may overlap touch sensor circuitry. Haptic output devices may be used to provide haptic feedback when virtual buttons are selected (as an example).

Device 10 of FIG. 2 has a rectangular outline (rectangular periphery) with four rounded corners. If desired, device 10 may have other shapes. For example, device 10 may have a shape that folds and unfolds along a bend (folding) axis and may include a display that overlaps or that does not overlap the bend axis, may have a shape with an oval footprint or circular outline, may have a cubic shape, may have a pyramidal, cylindrical, spherical, or conical shape, or may have other suitable shapes. The configuration of FIG. 2 is illustrative.

If desired, openings may be formed in the surfaces of device 10. For example, a speaker port and optical windows for an ambient light sensor, an infrared proximity sensor, and a depth sensor may be formed in a region such as upper region 30 of front face FR. A fingerprint sensor, touch sensor button, force-sensitive button, or other sensor that operates through display 14 may be formed under the portion of display in lower region 32 on front face FR and/or other portions of front face FR and/or other external surfaces of device 10. Device 10 may be free of connector openings or an opening for a connector (e.g., a digital data connector, analog signal connector, and/or power connector) may be formed in portion 34 of the lower sidewall of device 10 running along lower edge B or elsewhere in device 10. Openings may be omitted when power is received wirelessly or is received through contacts that are flush with the surface of device 10 and/or when data is transferred and received wirelessly using wireless communications circuitry in circuitry 22 or through contacts that are flush with the exterior surface of device 10.

Figure 3:
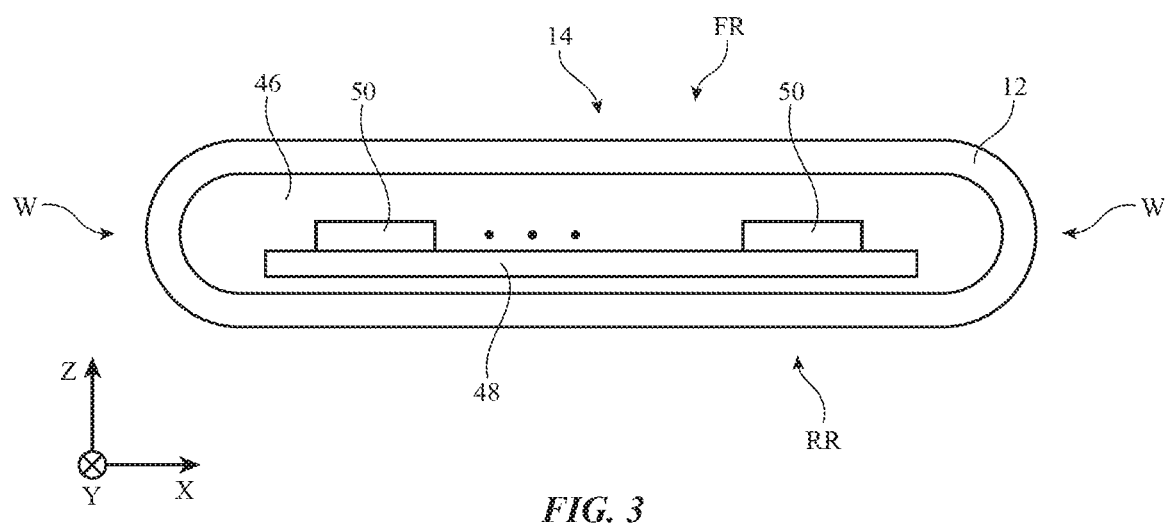
FIG. 3 is a cross-sectional side view of an illustrative electronic device in accordance with an embodiment.

FIG. 3 is a cross-sectional side view of an illustrative electronic device. As shown in FIG. 3, device 10 may have a housing such as housing 12. Housing 12 may include structures formed from glass, polymer, metal, wood, sapphire or other crystalline material, ceramic, fabric, other materials, and/or combinations of these materials. In some configurations, transparent portions of housing 12 may be configured to form display cover layers that overlap one or more displays or other light-emitting optical components. In the example of FIG. 3, display 14 is formed on front face FR of device 10. Display 14 includes an array of pixels. During operation, the pixels are used to display an image for viewing by a user of device 10. Arrays of pixels for displays in device 10 may sometimes be referred to as pixel layers, pixel array layers, displays, display structures, display layers, or display panels. In general, displays and other optical components may be located on front face FR, rear face RR, and/or sidewalls W of device 10 (e.g., sidewalls on edges T, B, R, and/or L). Housing 12 may have planar portions (e.g., in central portions of front face FR and rear face RR and/or on sidewalls W of device 10) and/or curved portions (e.g., curved edges, curved corners, portions of front face FR and/or rear face RR that have curved cross-sectional profiles, etc.).

As shown in FIG. 3, device 10 may include electrical components 50 in interior 46 (e.g., integrated circuits, sensors and other input-output devices, control circuitry, display layers such as organic light-emitting diode panels or other display layers, etc.). Electrical components 50 may, if desired, be mounted on printed circuits such as printed circuit 48 (e.g., flexible printed circuits and/or printed circuits formed from rigid printed circuit board material). In some configurations, a display may be formed on rear face RR. In other configurations, no display is present on rear face RR. In configurations in which no display is present on rear face RR, the portion of housing 12 on rear face RR may be formed from metal (e.g., a stainless steel or aluminum layer). For example, device 10 may have a rear housing wall formed from metal and may have optional sidewalls that extend upwardly from the rear housing wall. If desired, device 10 may have a rear housing wall and/or other housing walls formed from opaque glass, transparent glass coated with opaque materials such as ink or metal, and/or other housing wall materials.

In some configurations for device 10, an opaque material such as metal or opaque polymer may form some or all of sidewalls W of device 10. As an example, metal that forms some or all of a rear housing wall on rear face RR of device 10 may protrude upwardly along the edges of device 10 to form some or all of the sidewalls for device 10. As another example, a peripheral metal band that forms some or all of the sidewalls of device 10 may extend around the rectangular periphery of device 10 (e.g., along upper edge T, right edge R, lower edge B, and left edge L). Sidewalls may have vertically extending planar surfaces and/or may exhibit other surface profiles (e.g., curved profiles).

If desired, some or all of the sidewalls of device 10 may be formed from clear material and may overlap light-producing components. This material may, as an example, be part of a display cover layer (e.g., a sidewall may be formed from an extension of a central display cover layer portion and may be formed from glass, polymer, crystalline material, etc.). Because clear layers of glass, plastic, crystalline material, and/or other clear layers of material in device 10 may enclose and protect internal device components, these outer layers of material in device 10 may serve as portions of housing 12 for device 10.

In configurations for device 10 in which sidewalls have transparent portions formed from extending portions of a display cover layer or other transparent material, the sidewalls may overlap light-emitting components. Transparent sidewalls may have planar and/or curved surfaces and may be formed from clear glass, clear polymer, transparent crystalline material such as sapphire, and/or other transparent protective material. Displays (pixel arrays), light-emitting diodes covered with diffusing material, light-emitting diodes covered with patterned masks (e.g., opaque coatings with icon-shaped openings or openings of other shapes), and/or other light-emitting devices may be placed under clear sidewalls.

Figure 4:
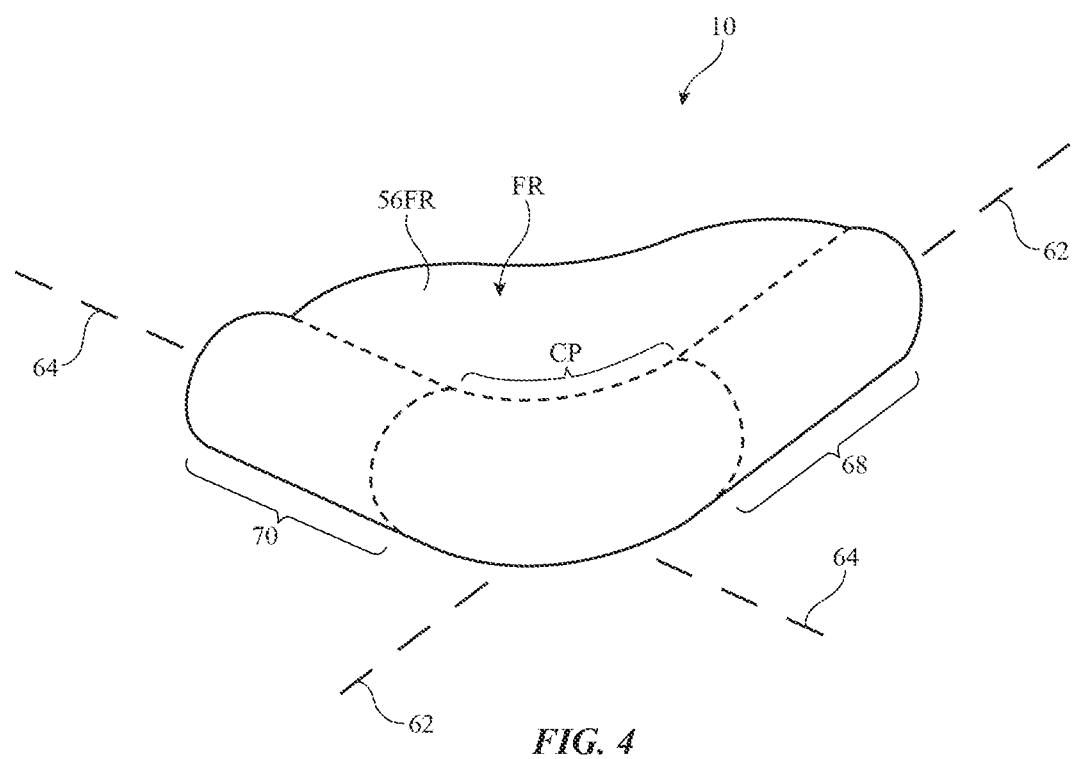
FIG. 4 is a perspective view of an illustrative corner of an electronic device in accordance with an embodiment.

If desired, device 10 may have external surfaces with compound curvature. A perspective view of an illustrative corner portion of device 10 is shown in FIG. 4. In the example of FIG. 4, device 10 has edge portions 68 and 70 formed from sidewalls W (FIG. 3).

Edge portions 68 and 70 may have surfaces that curve about axes 62 and 64, respectively. These portions of housing 12 extend along the straight sides of device 10 and are characterized by curved surfaces that can be flattened into a plane without distortion (sometimes referred to as developable surfaces). At the corner of device 10 of FIG. 4, device 10 has curved surface portions CP with compound curvature (e.g., a surface that can only be flattened into a plane with distortion, sometimes referred to as a surface with Gaussian curvature). Each of the four corners of device 10 may have this arrangement, if desired.

Flexible displays such as organic light-emitting diode displays with flexible polyimide substrates or other bendable polymer substrates can be bent about axes such as axes 62 and 64 to form curved surfaces in portions 68 and 70 (e.g., these substrates may be bent without wrinkling or other undesired deformation). In compound curvature regions such as corner regions of device 10, display 14 can be formed from materials that stretch (e.g., displays formed from mesh-shaped elastomeric substrate material), may be formed from flexible displays that are patterned to create one or more flexible strips and/or other structures that can be bent to cover at least part of the compound curvature regions, may be formed from bent tab portions that are part of a display (display substrate) that also is overlapped by a display cover layer on front face FR and/or other portions of device 10, may be formed using pixels on one or more display substrates that are separate from a main central display substrate, and/or may be formed from other display structures.

To help accommodate optical components within housing 12, device 10 (e.g., housing 12) may include one or more image transport layer structures (e.g., coherent fiber bundles or Anderson localization material). The image transport layer structures may transport light (e.g., image light and/or other light) from one surface to another while preventing the light from spreading laterally and thereby preserving the integrity of the image light or other light. This allows an image produced by an array of pixels in a flat or curved display to be transferred from an input surface of a first shape at a first location to an output surface with compound curvature or other desired second shape at a second location. The image transport layer may therefore move the location of an image and may optionally change the shape of the surface on which the image is presented.

Figure 5:
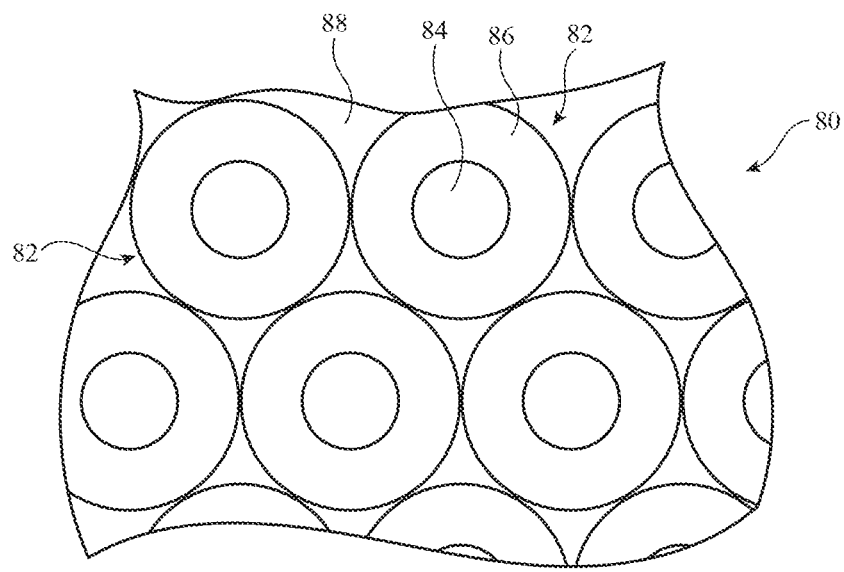
FIG. 5 is a cross-sectional side view of an illustrative image transport layer in accordance with an embodiment.

Fiber bundles include fiber cores of a first refractive index surrounded by cladding (e.g., polymer) of a second, lower refractive index. In some configurations, additional polymer, which may sometimes be referred to as binder or secondary cladding, may be included. A cross-sectional view of an illustrative image transport layer formed from a fiber bundle is shown in FIG. 5. In the example of FIG. 5, image transport layer 80 is formed from a bundle of fibers 82. Fibers 82 may have respective fiber cores 84. Cores 84 may be surrounded by material with a different index of refraction than cores 84. For example, each core 84 may have a first index of refraction and the material surrounding that core may have a second index of refraction that is lower than the first index of refraction by an index difference of at least 0.05, at least 0.1, at least 0.15, at least 10%, at least 20%, less than 50%, less than 30%, or other suitable amount. When the material surrounding cores 84 has a refractive index that is lower than cores 84, light may be guided within cores 84 in accordance with the principal of total internal reflection.

In the example of FIG. 5, cores 84, which may be formed from transparent material such as glass or polymer, are surrounded by lower index structures such as claddings 86 (e.g., glass or polymer of lower refractive index). Additional material (e.g., optional binder 88) may be included in image transport layer 80 (e.g., to hold fibers 82 in place, etc.). Binder 88 may be formed from a material (e.g., polymer or glass) with a refractive index lower than that of cores 84 and/or lower than that of cladding 86 to promote total internal reflection in cores 84. In some configurations, cores 84 may be coated with metal and/or surrounded by air or other material to help confine light within cores 84. Arrangements in which some of cores 84, some of cladding 86, and/or some of binder 82 are formed from materials such as opaque material, colored transparent material, infrared-light-blocking-and-visible-light-transmitting material, infrared-light-transmitting-and-visible-light-blocking material, and/or other materials may also be used. For example, some of these structures may be formed from a black polymer or other light-absorbing material to help absorb stray light (e.g., light that is not being guided within cores 84). If desired, polymer 88 may be omitted (e.g. in arrangements in which cladding 86 is used to hold fibers 82 together in image transport layer 80).

The diameters of cores 84 may be, for example, at least 5 microns, at least 7 microns, at least 8 microns, at least 9 microns, less than 40 microns, less than 17 microns, less than 14 microns, less than 11 microns, or other suitable diameter. Fibers 82 may have diameters of at least 6 microns, at least 7 microns, at least 8 microns, at least 9 microns, less than 50 microns, less than 17 microns, less than 14 microns, less than 11 microns, or other suitable diameter.

Figure 6:
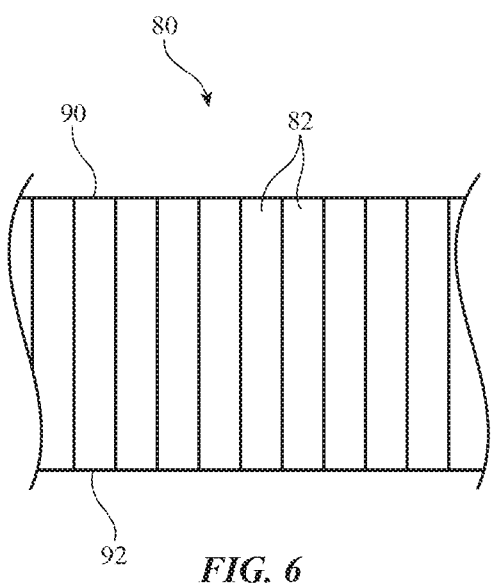
FIG. 6 is a cross-sectional side view of an illustrative image transport layer in accordance with an embodiment.

As shown in FIG. 6, fibers 82 may extend parallel to each other in image transport layer 80 (e.g., the fibers may run next to each other along the direction of light propagation through the fiber bundle). This allows image light or other light that is presented at input surface 90 to be conveyed to output surface 92. In the example of FIG. 6, surfaces 90 and 92 are planar and fibers 82 extend in straight lines between surfaces 90 and 92. Other arrangements such as arrangements in which fibers 82 are bent and/or taper and/or in which surface 90 and/or surface 92 have curved cross-sectional profiles may also be used.

In general, image transport layers such as image transport layer 80 of FIG. 6 and the other FIGS. may be formed from a coherent fiber bundle (see, e.g., FIG. 5) or may be formed from Anderson localization material instead of a coherent fiber bundle. Anderson localization material is characterized by transversely random refractive index features (higher index regions and lower index regions) of about two wavelengths in lateral size that are configured to exhibit two-dimensional transverse Anderson localization of light (e.g., the light output from the display of device 10). These refractive index variations are longitudinally invariant (e.g., along the direction of light propagation, perpendicular to the surface normal of a layer of Anderson localization material). Configurations in which image transport layer 80 has a bundle of fibers 82 are sometimes described herein as an example.

Fiber bundles and Anderson localization material can be used to form plates (e.g., layers with a thickness of at least 0.2 mm, at least 0.5 m, at least 1 mm, at least 2 mm, at least 5 mm, less than 20 mm, or other suitable thickness) and/or other image transport structures (e.g., straight and/or bent elongated light pipes, spherical shapes, cones, tapered shapes, etc.). As described in connection with FIG. 6, the surfaces of image transport structures may be planar and/or may have curved profiles.

Image transport layers can be used to transport an image from a first surface (e.g., the surface of a pixel array) to a second surface (e.g., a surface in device 10 with compound curvature or other curved and/or planar surface shape) without causing the image light to spread laterally. For example, an image that is produced by a display can be transported 5 mm vertically through an image transport layer that is 5 mm thick and can then be viewed on the output surface of the image transport layer. As another example, an image transport layer may have a planar input surface and an output surface with a planar central region surrounded by curved edges and corners of compound curvature. With this type of arrangement, images produced by a display that rests against the planar input surface can be smoothly transported to an output surface without becoming blurred, even if the output surface contains curved portions such as areas of compound curvature. Curved image transport layer surfaces can be formed by polishing, slumping heated fiber bundle material, molding under heat and/or pressure, etc. In devices with optical sensors and other optical components, light may, if desired, be transported through an image transport structure to and/or from an optical component.

In portions of device 10 that have an externally viewable display, a display cover layer that forms at least part of housing 12 may be used to cover and protect image transport layer 80 or an image transport layer that is uncovered by a separate display cover layer may be used in forming at least part of housing 12.

In arrangements in which a display cover layer is used to cover and project layer 80, adhesive, touch sensor structures, diffuser layers, masking layers, filter layers, antireflection layers, and/or other structures may optionally be interposed between layer 80 and the display cover layer. The display cover layer may be formed from glass, polymer, ceramic, crystalline material such as sapphire, multiple layers of these materials and/or other materials and may have optional coatings (e.g., an antireflection layer, an antiscratch layer, an antismudge layer, etc.). The display cover layer may form some or all of housing 12 of FIG. 3. A display layer with an array of pixels that displays an image may be located within the interior of housing 12. Image transport layer 80 may be interposed between the array of pixels and the display cover layer so that the image on the pixel array is transported from the input surface of the image transport layer to the output surface of the image transport layer. The image on the output surface of the image transport layer is visible through the display cover layer forming the portion of housing 12 that overlaps the image transport layer.

In arrangements in which no display cover layer is present, one or more portions of housing 12 of FIG. 3 may be formed from an image transport layer that is not covered with a separate protective member. For example, an image transport layer with a planar central portion, curved peripheral edges, and corners of compound curvature may be used to form an upper portion and sidewall portion of housing 12. In this type of configuration, the outside of image transport layer 80 is not covered with a separate display cover layer member so that output surface 92 forms the outermost surface of housing 12 of FIG. 3. The pixel array may be formed against input surface 90 of the image transport layer, which may form the innermost surface of housing 12 of FIG. 3.

During use, output surface 92 may contact external objects. To prevent damage to image transport layer 80 (e.g., the portion of housing 12 of FIG. 3 that overlaps the pixel array), output surface 92 may be strengthened using a chemical strengthening process or other strengthening process. For example, in a scenario in which layer 80 is formed from glass, surface 92 of layer 80 may be strengthened using an ion exchange chemical strengthening treatment and/or other strengthening processes (e.g., heat treatment, etc.). Chemical strengthening may be performed by placing a glass image transport layer in a heated potassium salt bath to perform an ion-exchange process. Chemical strengthening in this way may enhance the compressive stress of the outermost surfaces of the glass image transport layer relative to deeper portions. Heat treatment (e.g., thermal tempering) may also be used to create compressive stress on outer surfaces of image transport layer 80. By creating compressive stress on the surface of image transport layer 80, the strength of output surface 92 may be enhanced. If desired, an antiscratch coating, an antireflection coating, an antismudge coating, and/or other exterior coating layers may be applied to surface 92. When layer 80 is strengthened at output surface 92, layer 80 is able to withstand damage during drop events and other events that impose stress on layer 80.

Illustrative image transport layers 80 are shown in FIGS. 7, 8, 9, 10, and 11. Structures such as these may have lower surfaces that serve as input surfaces (e.g., to receive image light from a display) and opposing upper surfaces (e.g., surfaces with curved edges aligned with the periphery of device 10). For example, structures such as these may be provided on front surface FR so that the curved edges of these structures run around the periphery of device 10 while the planar portions of these structures overlap the center of display 14 on front surface FR (as an example).

Figure 7:
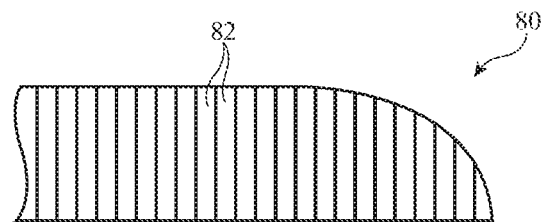
FIGS. 7, 8, 9, 10, and 11 are cross-sectional side views of illustrative image transport layers in accordance with embodiments.

As shown in the example of FIG. 7, fibers 82 may be oriented to extend vertically through image transport layer 80.

Figure 8:
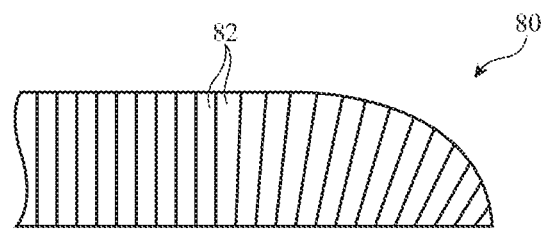

FIG. 8 shows how fibers 82 may be tilted by progressively increasing amounts at increasing distances toward the curved outer peripheral edge of image transport layer 80.

Figure 9:
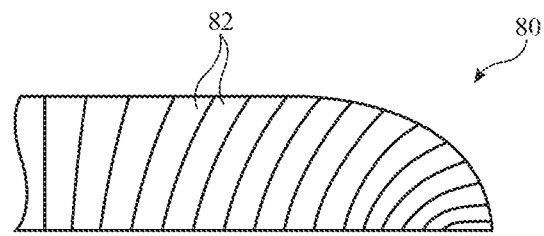

In the example of FIG. 9, fibers 82 are both tilted and curved.

Figure 10:
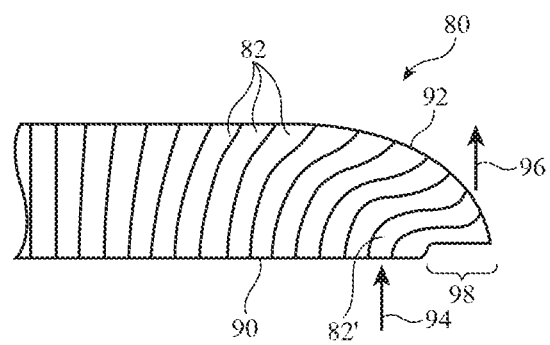

FIG. 10 shows how fibers 82 may contain multiple bends along their lengths. This allows the entrances and exit portions of the fibers to be oriented along the desired direction of light propagation. As an example, fiber 82' may have an entrance portion with a longitudinal axis that is aligned parallel or nearly parallel to light entrance direction 94 so that light from a display or other optical component may be emitted efficiently into fiber 82 in direction 94. Fiber 82' may also have an exit portion with a longitudinal axis that is aligned parallel or nearly parallel to light emission direction 96 (e.g., a direction facing a viewer) so that light emitted from the curved edge portion of image transport layer will be directed toward the viewer rather than being angled away from the viewer. If desired, the entrance and output faces of each fiber may be oriented to facilitate light output in desired directions. Optional grooves and other structures may also be formed in image transport layer 80 (see, e.g., illustrative peripheral groove 98). This may facilitate the coupling of layer 80 to a housing structure and/or may otherwise facilitate the mounting of image transport layer 80 within device 10 (as an example).

Figure 11:
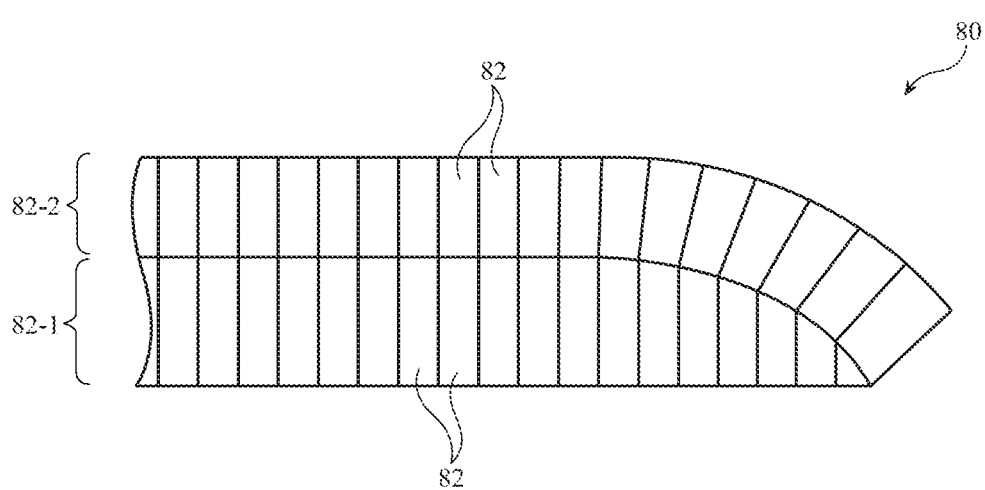

In the illustrative configuration of FIG. 11, image transport layer 80 has multiple overlapped portions such as lower portion 80-1 and upper portion 80-2. Portions 80-1 and 80-2 may be plates or other layers that have fibers 82 with different orientations. As an example, portion 80-1 may have vertically oriented fibers 82 and portion 80-2 may have tilted fibers that are oriented at a non-zero angle with respect to fibers 82 in portion 80-1. Fibers 82 in different portions of layer 80 may, if desired, be aligned end-to-end. Arrangements in which fibers 82 in different portions of layer 80 are not aligned may also be used. If desired, image transport layer 80 may have three or more overlapped layers of fibers with potentially different orientations and/or shapes. Each sublayer of fibers 82 in layer 80 may have input and/or output surfaces that are planar and/or that are curved. The configuration of FIG. 11 is merely illustrative.

Device 10 may include one or more protective structures formed from clear portions of housing 12. As an example, housing 12 of device 10 may have a clear portion such as portion 12-1 of FIG. 12 that overlaps image transport layer 80 and display layer 100. Housing 12 may also have a portion such as portion 12-2 (e.g., a metal housing wall, a transparent housing wall such as a glass housing wall with an inner surface covered with an opaque masking material such as ink, metal, and/or other coating materials, and/or other housing wall materials).

Portion 12-1 may form a display cover layer that covers a display layer such as display layer 100. Display layer 100 may have an active area such as active area 104 with an array of pixels 102 that display an image for a viewer such as viewer 108 who is viewing device 10 in direction 110. Display layer 100 may also have an inactive area such as inactive border area 106 that contains metal signal paths, display driver circuitry, encapsulation structures, and other structures that do not emit light. Inactive border area 106 of display layer 100 is free of pixels and therefore does not display any part of the image that is displayed by display layer 100. In some configurations, portion 12-1 may be omitted, so that image transport layer 80 forms housing 12 over display layer 100 and so that output surface 92 forms the outermost portion of housing 12 above display layer 100. The arrangement of FIG. 12 is illustrative.

Figure 12:
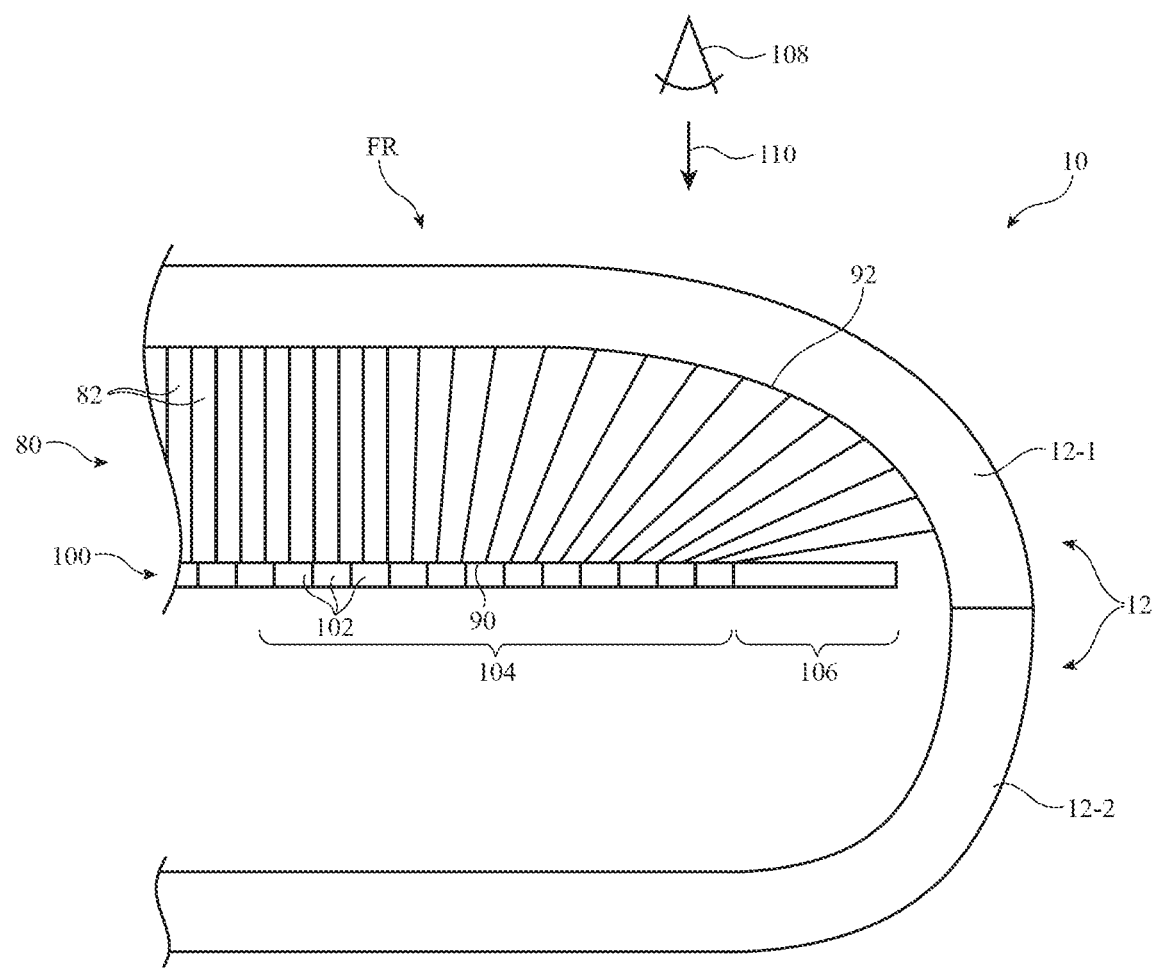
FIGS. 12, 13, and 14 are cross-sectional side views of portions of illustrative electronic devices with image transport layers in accordance with embodiments.

To help hide inactive border area 106 from view by viewer (user) 108, some of fibers 82 of image transport layer 80 may be tilted as shown in FIG. 12. As a result, the image from the pixel array in active area 104 on input surface 90 of layer 80 will be transported to an enlarged output surface 92. Surface 92 overlaps inactive border area 106 when device 10 and display layer 100 are viewed in direction 110 as viewer 108 is viewing front face FR of device 10, so that the image on surface 92 extends to the outermost periphery of device 10 or nearly to the outermost periphery of device 10, thereby hiding inactive border area 106 from view. Image transport layer 80 of FIG. 12 also has a curved edge profile and may have corners of compound curvature.

Figure 13:
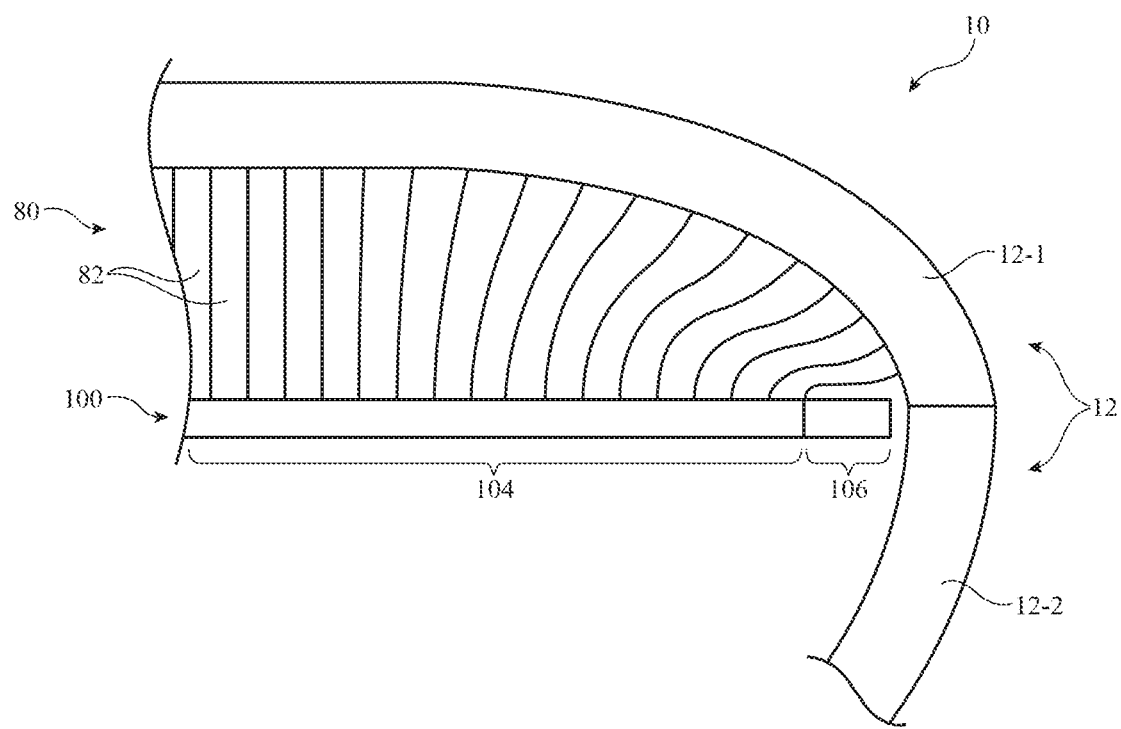
Figure 14:
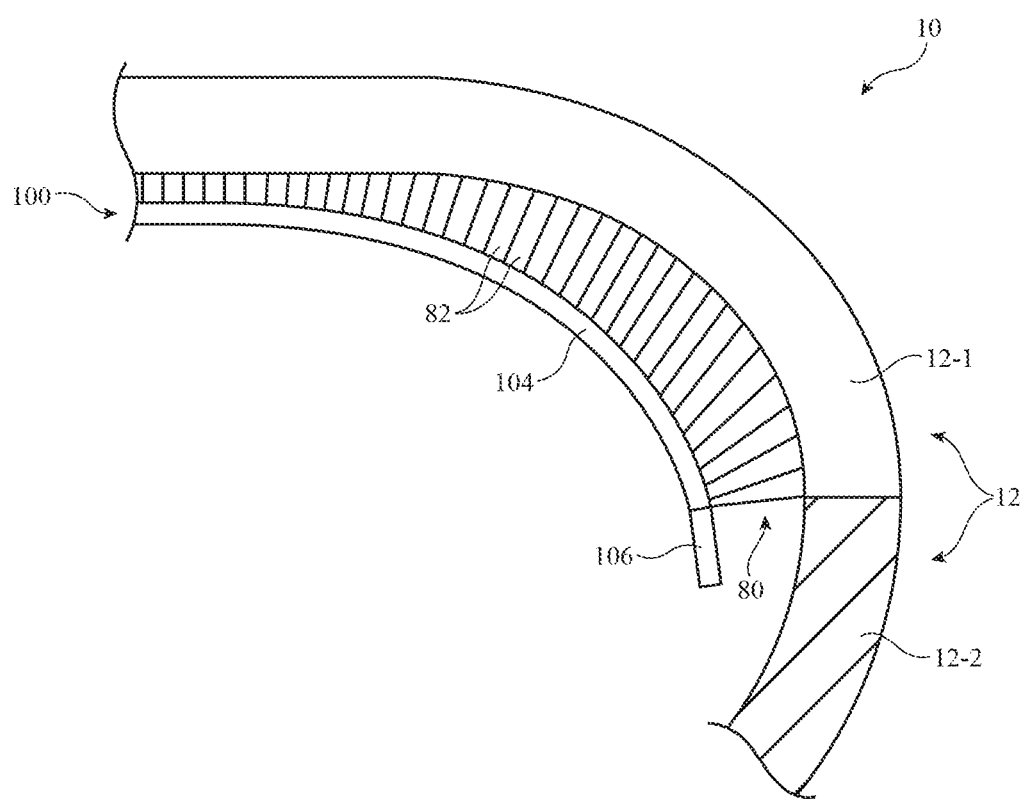

In the example of FIG. 12, fibers 82 are tilted by increasing amounts at increasing distances from the outer edge of area 104 toward the periphery of device 10. If desired, fibers 82 may have one or more bends along their lengths, as shown in the illustrative arrangement for device 10 that is shown in FIG. 13. FIG. 14 shows how display layer 100 may, if desired, have one or more portions that are bent. Layer 100 may, as an example, be formed from an organic light-emitting diode display substrate of polyimide or other flexible polymer covered with thin-film transistors, thin-film organic light-emitting diode pixels, and/or other thin-film circuitry. In this type of arrangement, layer 100 may have one, two, three, four, or more than four edges with curved cross-sectional profiles as shown in FIG. 14. Image transport layer 80 may have a mating curved input surface that receives an image from layer 100 and may have a curved output surface. The curved output surface of image transport layer 80 may mate with the curved inner surface of housing portion 12-1.

Other arrangements for placing image transport layer 80 over display layer 100 may be used, if desired. For example, portions of image transport layer 80 may, if desired, overlap opaque housing structures (e.g., to provide device 10 with a borderless appearance). Image transport layer 80 may also serve as the outermost structure of device 10 (e.g., housing portion 12-1 may be omitted). The configurations of FIGS. 12, 13, and 14 are illustrative.

In some configurations, portions of device 10 are not covered with active portions of display 14 and are therefore available to accommodate components such as sensors 16, speakers, and/or other electrical components. For example, one or more areas on front face FR of device 10 may be available to accommodate electrical components. These areas may be free of pixels and free of any of the output surface of image transport layer 80 that is emitting an image presented to the input surface of that image transport layer.

Sensors such as capacitive sensors, radio-frequency circuitry, signal lines, electrical components for forming sensors and other input and output devices, and other circuitry may be incorporated into image transport layer 80. This type of arrangement may help place electrical components at a desired distance (e.g., a small distance) from the outermost surface of device 10. For example, by placing capacitive sensor circuitry in image transport layer 80, capacitive sensor electrodes in layer 80 may be placed close to the exterior surface of device 10, thereby enhancing sensor accuracy and sensitivity when making sensor measurements. As another example, placement of wireless circuitry such as antennas within image transport layer 80 may help separate such wireless circuitry from potentially interfering conductive structures in the interior of device 10 and can enhance wireless signal transmission and reception.

Figure 15:
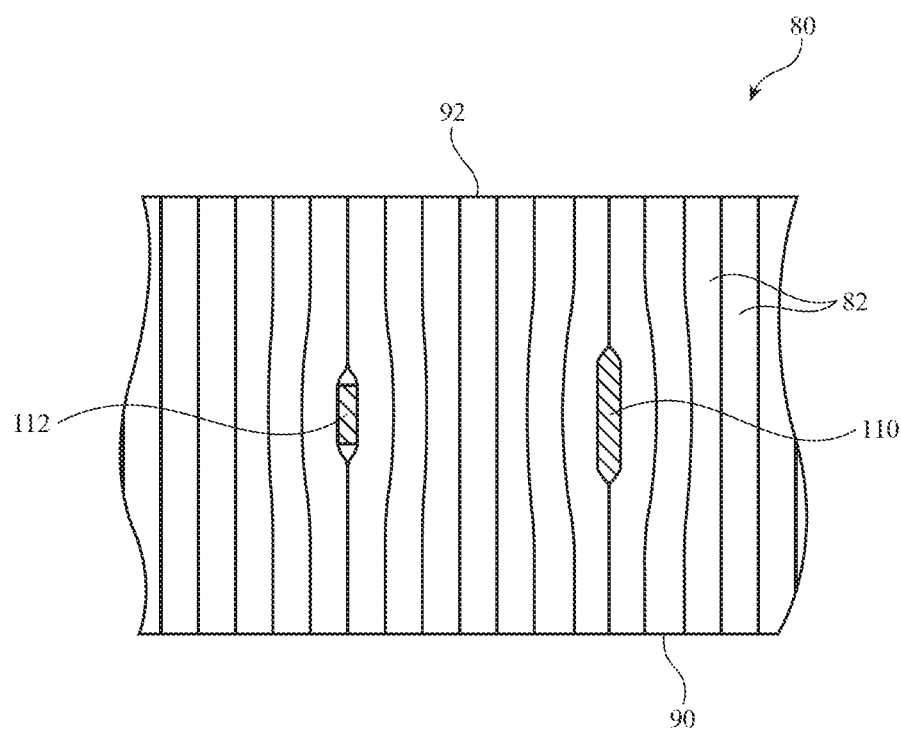
FIG. 15 is a cross-sectional side view of an illustrative image transport layer with embedded circuitry in accordance with an embodiment.

FIG. 15 is a cross-sectional side view of an illustrative image transport layer into which electrical structures have been embedded. As shown in FIG. 15, image transport layer 80 may have an input surface such as input surface 90 and a corresponding output surface such as output surface 92. Images that are provided to input surface 90 are transported to output surface 92 for viewing by a user. The material of layer 80 (e.g., Anderson localization material or fibers 82) may be configured to accommodate embedded structures. For example, fibers or other material may be bent around conductive structures such as metal structure 110 and/or electrical components such as component 112. In this way, sufficient space may be made available for structures within layer 80 without disrupting the image transport capabilities of image transport layer 80 (e.g., an image can still be transported from input surface 90 to output surface 92 during operation). As shown in FIG. 15, structure 110 and component 112 may be located between surfaces 90 and 92 and need not touch surfaces 90 and 92. Arrangements in which some of structure 110 and/or component 112 reach surface 90 and/or surface 92 may also be used.

Metal structure 110 may be a trace (e.g., a metal trace) formed from a thin-film metal layer (e.g., a deposited metal coating or other conductive thin-film layer), may be a metal wire, may be a strip of metal foil formed by stamping, laser cutting, or other patterning techniques, and/or may be other conductive structures.

Component 112 may be a packaged electrical component such as a packaged integrated circuit, may be a haptic output device (e.g., a piezoelectric actuator), may be a capacitive sensing device, may be a force sensor, may be an audio component, may be a temperature sensor, and/or may be any other suitable electronic device (see, e.g., the components of input-output devices 24, communications circuitry 22, and control circuitry 20 of FIG. 1). If desired, circuitry such as structure 110 and/or component 112 may be distributed within layer 80. As an example, a touch sensor may have an array of capacitive sensor elements and an array of haptic feedback devices in layer 80. As another example, a capacitive sensor may have capacitive sensor electrodes (e.g., metal pillars, pads, and/or lines) and signal routing lines embedded within layer 80. Component 112 may, if desired, be an optical component and portions of layer 80 (e.g., one or more fibers 82 overlapping component 112) may be configured to transmit and/or receive light between component 112 and output surface 92 (e.g., in a configuration in which some but not all of the fibers 82 of layer 80 bend around component 112). Arrangements in which components such as component 112 and structures such as structure 110 are hidden within layer 80 by routing the fibers or other material in layer 80 around component 112 and structure 110 as shown in FIG. 15 may sometimes be described herein as an example.

Figure 16:
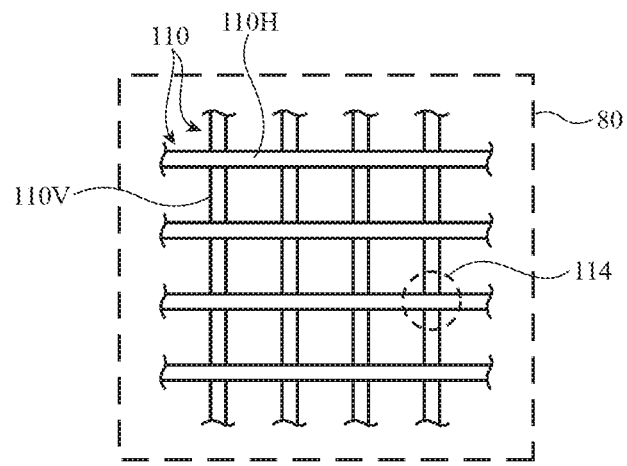
FIG. 16 is a top view of an illustrative image transport layer with an embedded grid of conductive lines in accordance with an embodiment.
Figure 17:
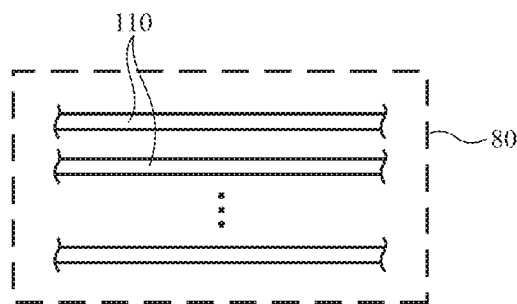
FIG. 17 is a top view of an illustrative image transport layer with an embedded set of parallel signal lines in accordance with an embodiment.
Figure 18:
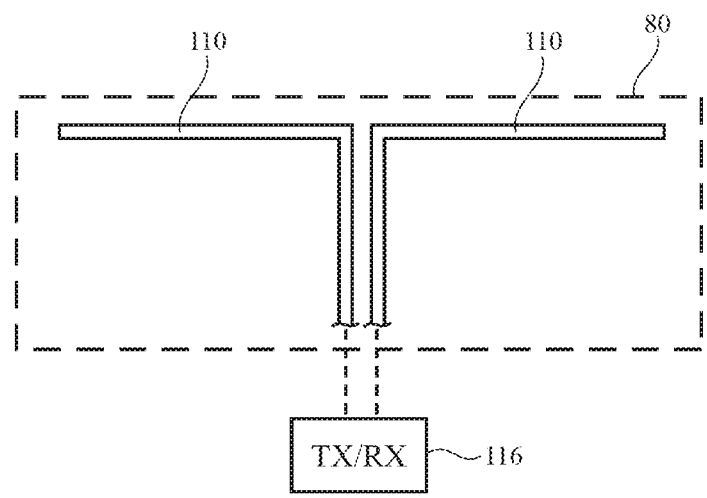
FIG. 18 is a top view of an illustrative image transport layer with an embedded antenna resonating element in accordance with an embodiment.

FIGS. 16, 17, and 18 are top (plan) views of illustrative configurations for embedded structures (e.g., conductive structures such as metal structures 110) within image transport layer 80.

In the example of FIG. 16, metal structures 110 include horizontal metal lines 110H and vertical metal lines 110V. Lines 110H and 110V may cross each other at right angles to form a grid that extends laterally across image transport layer 80. For example, lines 110H and 110V may be used to form capacitive sensor electrodes (e.g., drive lines and sense lines) in a two-dimensional capacitive touch sensor. With this type of arrangement, capacitive sensor circuitry coupled to metal structures 110 may detect which intersection between lines 110H and 110V is being overlapped by a user's finger or other external object (see, e.g., illustrative finger location 114 of FIG. 16). In this way, a two-dimensional capacitive sensor formed using metal structures 100 of FIG. 16 may determine the location of finger input or other touch input. If desired, other types of electrode shapes and/or signal line patterns may be used to gather capacitive sensor input (e.g., non-grid patterns of conductive lines, patterns with diagonal lines, electrode patterns with pillars and/or pads of electrode material, etc.).

As shown in FIG. 17, metal structures 110 may form signal paths. For example, metal structures 110 may form metal signal lines (e.g., one or more lines such as the illustrative set of parallel signal lines of FIG. 17). The signal lines that are formed may form a data but that carries serial and/or parallel data. The signal paths formed by metal structures 110 may also form transmission lines for carrying radio-frequency signals. In general, analog signals, digital signals, power signals, radio-frequency signals, and/or other signals may be conveyed by signal paths formed from metal signal lines or structures 110.

In the example of FIG. 18, metal structures 110 have been configured to form an antenna. The antenna may include an antenna resonating element, antenna ground structures, parasitic antenna resonating elements, and/or other suitable antenna structures). In the example of FIG. 18, the antenna includes a dipole antenna resonating element (as an example). In some configurations, a portion of housing 12 or other structures in the device 10 may serve as an antenna ground or other antenna structure. In general, any suitable type of antenna may be formed from metal structures 110. The antennas formed using structures 110 may be, for example, antennas with resonating elements that are formed from patch antenna structures, loop antenna structures, inverted-F antenna structures, slot antenna structures, planar inverted-F antenna structures, monopoles, dipoles, helical antenna structures, Yagi (Yagi-Uda) antenna structures, hybrids of these designs, etc. If desired, one or more of the antennas may be cavity-backed antennas. Different types of antennas may be used for different bands and combinations of bands. For example, one type of antenna may be used in forming a local wireless link antenna and another type of antenna may be used in forming a remote wireless link antenna. Dedicated antennas may be used for receiving satellite navigation system signals or, if desired, antennas can be configured to receive both satellite navigation system signals and signals for other communications bands (e.g., wireless local area network signals and/or cellular telephone signals). Dedicated antennas may be used for performing millimeter and centimeter wave spatial ranging operations if desired. The antennas in layer 80 may include antennas arranged in one or more phased antenna arrays for handling millimeter and centimeter wave communications and/or for handling spatial ranging operations.

The antenna formed from metal structures 110 may be coupled by a transmission line or other circuitry to radio-frequency transceiver circuitry 116 (e.g., transceiver circuitry in communications circuitry 22 of FIG. 1). Circuitry 116 may include Global Positioning System (GPS) receiver circuits, local wireless transceiver circuits, remote wireless transceiver circuits (e.g., cellular telephone circuitry), and/or millimeter wave transceiver circuits, near-field communications circuits. If desired, antennas (e.g., coil antennas and/or patch antennas formed from metal structures 110) can also be used in transmitting and/or receiving wireless power signals using wireless power transmitting and/or receiving circuitry in device 10.

Local wireless transceiver circuits in transceiver circuitry 116 may include wireless local area network (WLAN) transceiver circuitry. Wireless local area network transceiver circuitry may handle 2.4 GHz and 5 GHz bands for WiFi® (IEEE 802.11) communications and may handle the 2.4 GHz Bluetooth® communications band.

Remote wireless transceiver circuits in transceiver circuitry 116 may include cellular telephone transceiver circuitry. Cellular telephone transceiver circuitry may handle wireless communications in frequency ranges such as a communications band from 700 to 960 MHz, a communications band from 1710 to 2170 MHz, and a communications band from 2300 to 2700 MHz or other communications bands between 600 MHz and 4000 MHz or other suitable frequencies (as examples). Cellular telephone transceiver circuitry may handle voice data and non-voice data.

Millimeter wave transceiver circuits in circuitry 116 (sometimes referred to herein as extremely high frequency (EHF) transceiver circuitry or millimeter wave transceiver circuitry) may support communications at frequencies between 10 GHz and 300 GHz. For example, millimeter wave transceiver circuitry may support communications in Extremely High Frequency (EHF) or millimeter wave communications bands between about 30 GHz and 300 GHz and/or in centimeter wave communications bands between about 10 GHz and 30 GHz (sometimes referred to as Super High Frequency (SHF) bands). As examples, millimeter wave transceiver circuitry may support communications in an IEEE K communications band between about 18 GHz and 27 GHz, a $K_a$ communications band between about 26.5 GHz and 40 GHz, a $K_u$ communications band between about 12 GHz and 18 GHz, a V communications band between about 40 GHz and 75 GHz, a W communications band between about 75 GHz and 110 GHz, or any other desired frequency band between 10 GHz and 300 GHz. If desired, millimeter wave transceiver circuitry may support IEEE 802.11ad communications at 60 GHz and/or $5^{th}$ generation mobile networks or $5^{th}$ generation wireless systems (5G) communications bands between 27 GHz and 90 GHz. Millimeter wave transceiver circuitry may also support communications at multiple frequency bands between 10 GHz and 300 GHz such as a first band from 27.5 GHz to 29.5 GHz, a second band from 37 GHz to 41 GHz, a third band from 57 GHz to 71 GHz, and/or other communications bands between 10 GHz and 300 GHz. Millimeter wave transceiver circuitry and/or other transceiver circuitry 116 may be formed from one or more integrated circuits (e.g., multiple integrated circuits mounted on a common printed circuit in a system-in-package device, one or more integrated circuits mounted on different substrates, etc.).

Figure 19:
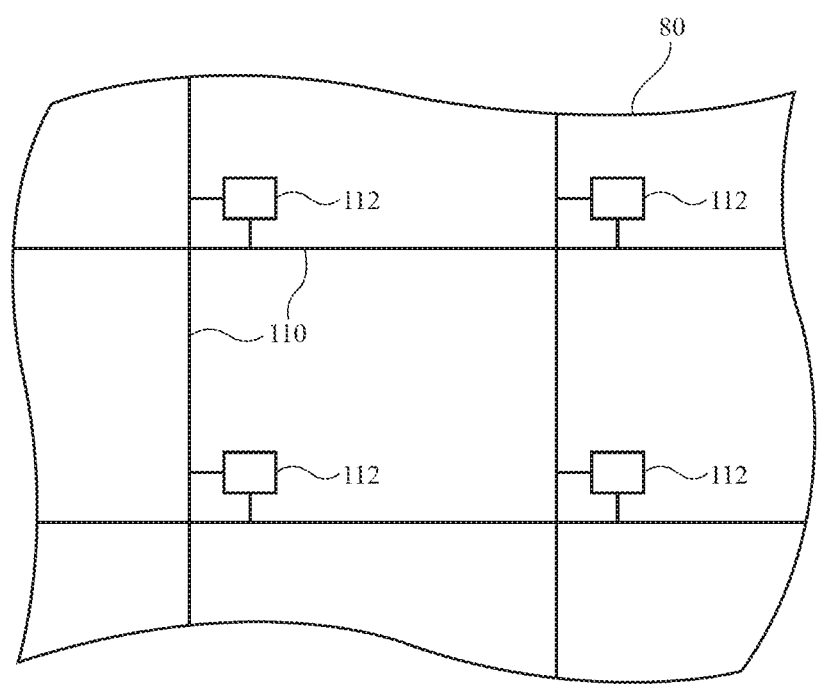
FIG. 19 is a top view of an illustrative image transport layer with an array of embedded components and associated signal lines in accordance with an embodiment.

FIG. 19 is a top view (sometimes referred to as a plan or front view) of an illustrative image transport layer with embedded circuitry. As shown in FIG. 19, the circuitry that is embedded in image transport layer 80 may include metal structures 110 configured to form vertical and/or horizontal signal lines extending laterally through image transport layer 80. These signal paths may be configured to route signals to and/or from an array of electrical components 112. As an example, components 112 may be arranged in an array with rows and columns, the components 112 of each row may be coupled to a signal line in that row, and the components 112 of each column may be coupled to a signal line in that column. With this type of arrangement, individual components 112 may be addressed. For example, control circuitry in device 10 may control a component 112 to cause that component 112 to provide desired output such as desired light output, desired haptic output, desired acoustic output, desired electrical output, or other desired output and/or control circuitry in device 10 may control a component 112 to obtain a sensor measurement or other input from that component 112 such as a desired capacitive sensor measurement, force measurement, temperature measurement, etc. Arrangements of the type shown in FIG. 19 may therefore be used to embed a two-dimensional array of input-output components (see, e.g., devices 24 of FIG. 1) within image transport layer 80 so that these components can be used in providing desired output and gathering desired input over a two-dimensional surface of image transport layer 80 and a corresponding two-dimensional surface of device 10.

Figure 20:
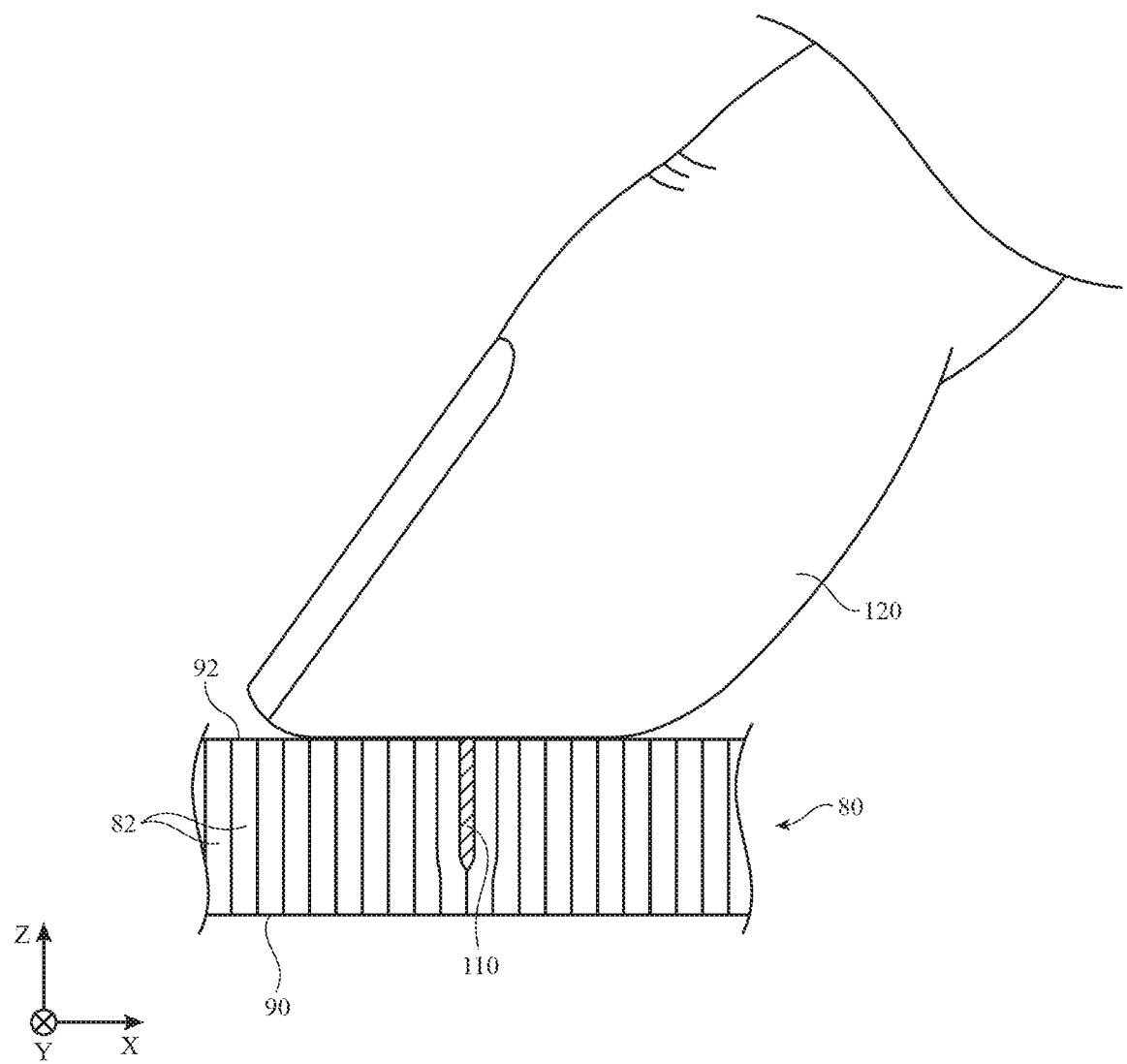
FIG. 20 is a cross-sectional side view of an illustrative image transport layer having embedded circuitry for forming a capacitive sensor electrode for a capacitive sensor in accordance with an embodiment.

If desired, portions of metal structures 110 may extend to one or both of the surfaces of image transport layer 80. As shown in FIG. 20, for example, image transport layer 80 may be uncovered by any display cover layer (housing structure 12-1 may optionally be omitted from device 10). Metal structures 110 may be embedded within image transport layer 80 (e.g., to form signal lines that extend in a two-dimensional pattern laterally across layer 80 in dimensions X and Y). Periodically (e.g., at different X and Y positions across layer 80), metal structures 110 may be configured to form a vertically extending pillar-like structure (see, e.g., the pillar formed by metal structure 110 of FIG. 20, which extends in the Z dimension). The tips of the pillars formed from metal structures 110 may be exposed at output surface 92. This allows these portions of metal structures 110 to be contacted directly by a user's finger (see, e.g., finger 120 of FIG. 20) or other external object. Capacitive sensor circuitry coupled to metal structures 110 may be used to measure capacitance changes in structures 110 due to the presence of finger 120 on a particular pillar or set of pillars (e.g., the pillars may serve as direct-contact capacitive sensor electrodes).

Figure 21:
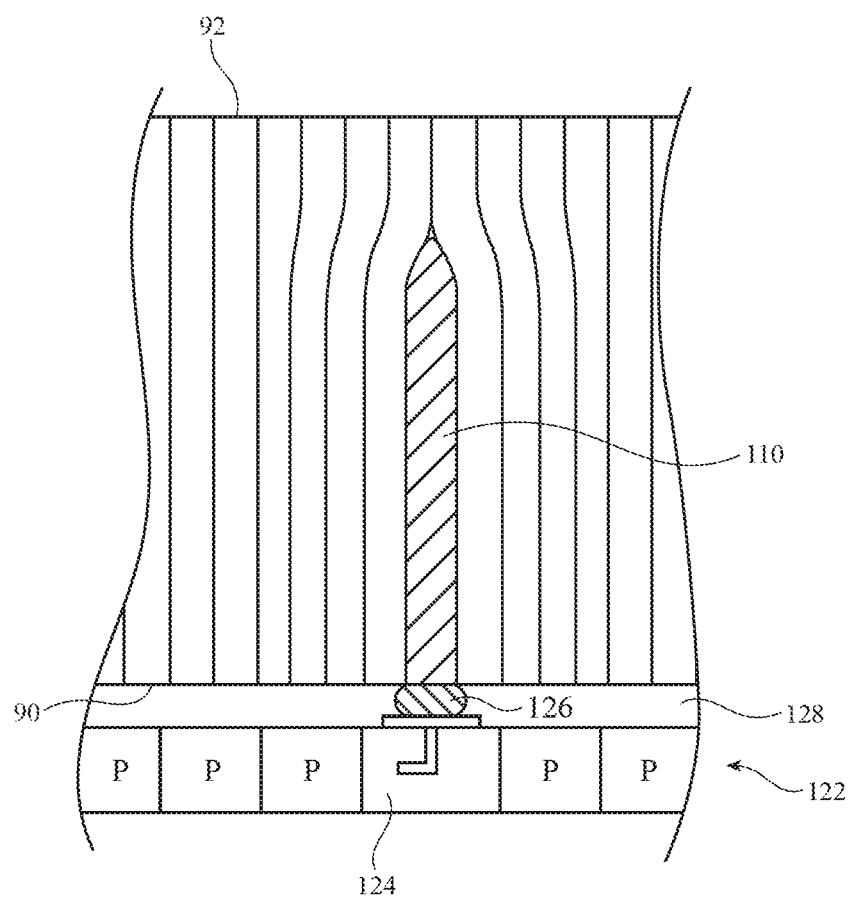
FIG. 21 is a cross-sectional side view of an illustrative image transport layer with embedded circuitry that is electrically coupled to circuitry on a substrate layer such as a display layer with organic light-emitting diode pixels in accordance with an embodiment.

In the example of FIG. 21, metal structures 110 have been configured to periodically contact thin-film circuitry in substrate 122. Substrate 122 may be a display layer (e.g., display layer 100) that has an array of pixels P (e.g., thin-film organic light-emitting diode pixels with light-emitting diodes and corresponding thin-film pixel control circuitry) or other suitable substrate. Thin-film circuitry in cells such as cell 124 and/or circuitry elsewhere in substrate 122 may be electrically coupled to metal structures 110. For example, conductive material 126 (e.g., solder, conductive adhesive, conductive material associated with a weld, etc.) may be used in electrically coupling metal structures 110 to circuitry in substrate 122 and/or control circuitry elsewhere in device 10. Capacitive coupling structures may also be used. Adhesive 128 may be used to couple substrate 122 to input surface 90 of image transport layer 80. Structures 110 may extend to surface 90 to electrically couple to circuitry in substrate 122 via conductive material 126 and, if desired, may extend to surface 92. Using this type of arrangement, metal structures 110 may be configured to form capacitive sensor electrodes and the circuitry of substrate 122 and/or other circuitry in device 10 may form capacitive sensor circuitry that is used in making capacitive sensor measurements (e.g., two-dimensional touch input measurements in a touch sensor).

As described above, one aspect of the present technology is the gathering and use of information such as sensor information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
   pixels configured to display an image;
   an image transport layer comprising a coherent fiber bundle configured to receive the image at an input surface of the coherent fiber bundle and to transport the received image through the image transport layer to an output surface of the coherent fiber bundle; and
   circuitry embedded within the coherent fiber bundle and between the input surface and the output surface.

2. The electronic device defined in claim 1, wherein the circuitry embedded within the coherent fiber bundle comprises an antenna resonating element, the electronic device further comprising:
   a housing;
   a display cover layer that overlaps the image transport layer and that is coupled to the housing; and
   communications circuitry coupled to the antenna resonating element.

3. The electronic device defined in claim 2 wherein the coherent fiber bundle comprises fibers that extend around the antenna resonating element.

4. The electronic device defined in claim 2 wherein the communications circuitry comprises radio-frequency transceiver circuitry coupled to the antenna resonating element and wherein the circuitry embedded within the coherent fiber bundle comprises a capacitive sensor electrode.

5. The electronic device defined in claim 1 wherein the circuitry embedded within the coherent fiber bundle comprises a packaged integrated circuit.

6. The electronic device defined in claim 1 wherein the circuitry embedded within the coherent fiber bundle comprises metal signal lines.

7. The electronic device defined in claim 1 wherein the circuitry embedded within the coherent fiber bundle comprises capacitive sensor electrodes.

8. The electronic device defined in claim 7 wherein the capacitive sensor electrodes extend in a grid across the image transport layer.

9. The electronic device defined in claim 1 wherein the circuitry embedded within the coherent fiber bundle comprises circuitry selected from the group consisting of: a sensor, an output component, an antenna, an electrode, and a signal line.

10. The electronic device defined in claim 1 wherein the circuitry comprises metal signal lines embedded in the coherent fiber bundle between the input surface and the output surface and wherein the circuitry comprises electrical components embedded in the coherent fiber bundle that are electrically coupled to the metal signal lines.

11. The electronic device defined in claim 1 further comprising:
    a housing structure having a transparent portion that overlaps the image transport layer; and
    an organic light-emitting diode display layer that includes the pixels.

12. The electronic device defined in claim 11 wherein the circuitry comprises a metal structure that is electrically coupled to the organic light-emitting diode display layer.

13. The electronic device defined in claim 1 wherein the circuitry includes a metal structure that has a portion that extends to the output surface.

14. The electronic device defined in claim 1 wherein the circuitry is configured to form a two-dimensional touch sensor overlapping the pixels.

15. An electronic device, comprising:
- pixels that display an image;
- a housing having a first portion that is transparent and that overlaps the pixels and having a second portion that is coupled to the first portion;
- an integrated circuit between the first and second portions of the housing;
- an image transport layer comprising a coherent fiber bundle having an input surface that receives the image and an output surface at which the received image is presented; and
- metal structures embedded in the coherent fiber bundle and electrically coupled to the integrated circuit, wherein the metal structures have a portion that extends to the output surface.

16. The electronic device defined in claim 15 wherein the metal structures are configured to form capacitive sensor electrodes.

17. The electronic device defined in claim 15 wherein the metal structures are configured to form an antenna resonating element.

18. The electronic device defined in claim 15 wherein the metal structures include antenna structures and sensor structures.

19. An electronic device, comprising:
- a display layer configured to display an image;
- a display cover layer;
- a housing wall that is coupled to the display cover layer;
- an image transport layer comprising a coherent fiber bundle having an input surface that receives the image from the display layer and an output surface on which the received image is viewable through the display cover layer;
- electrical components embedded within the coherent fiber bundle and between the input surface and the output surface; and
- circuitry that is electrically coupled to the electrical components.

* * * * *